United States Patent [19]

Forbes et al.

[11] Patent Number: 6,104,045
[45] Date of Patent: Aug. 15, 2000

[54] HIGH DENSITY PLANAR SRAM CELL USING BIPOLAR LATCH-UP AND GATED DIODE BREAKDOWN

[75] Inventors: Leonard Forbes, Corvallis, Oreg.; Wendell P. Noble, Jr., Milton, Vt.

[73] Assignee: Micron Technology, Inc., Boise, Id.

[21] Appl. No.: 09/076,745

[22] Filed: May 13, 1998

[51] Int. Cl.⁷ .............................. H01L 29/74; H01L 27/11
[52] U.S. Cl. .......................... 257/141; 257/140; 257/162; 257/903; 257/175; 257/180; 365/180; 365/175
[58] Field of Search .................................. 257/903, 140, 257/141, 162; 365/175, 180

[56] References Cited

U.S. PATENT DOCUMENTS

| | | | |
|---|---|---|---|
| 4,543,595 | 9/1985 | Vora | 365/175 |
| 4,720,845 | 1/1988 | Lechner | 379/27 |
| 5,173,754 | 12/1992 | Manning . | |
| 5,214,295 | 5/1993 | Manning . | |
| 5,286,663 | 2/1994 | Manning . | |
| 5,486,717 | 1/1996 | Kokubo et al. . | |
| 5,497,011 | 3/1996 | Terashima . | |
| 5,535,156 | 7/1996 | Levy et al. . | |
| 5,581,104 | 12/1996 | Lowry et al. . | |
| 5,594,683 | 1/1997 | Chen et al. . | |
| 5,624,863 | 4/1997 | Helm et al. . | |
| 5,650,350 | 7/1997 | Dennison et al. . | |
| 5,684,737 | 11/1997 | Wang | 365/175 |
| 5,705,843 | 1/1998 | Roberts . | |
| 5,710,741 | 1/1998 | McLaury . | |

OTHER PUBLICATIONS

D. L. Hetherington et al, An Integrated GaAs N–P–N–P Thyristor/JFET Memory Cell Exhibiting Nondestructive Read, IEEE Electron Device Letters, vol. 13, No. 9, Sep. 1992.

S. V. Vandebroek et al, High–Gain Lateral Bipolar Action in a MOSFET Structure, IEEE Transactions on Electron Devices, vol. 38, No. 11, Nov. 1991.

J.J. Ebers, Four–Terminal P–N–P–N Transistors, Proceedings of IRE, Nov. 1952, pp. 1361–1364.

I.T. Ho et al, Single Thyristor Static Memory and its Fabrication, vol. 23, No.3, 1980.

S. M. Sze, Physics of Semiconductor Devices, Second Edition, A Wiley Interscience Pub. 1981.

S.D. Malaviya, Single–Device DC Stable Memory Cell, IBM Technical Disclosure Bulletin, vol. 20, No. 9, pp. 3492–3494, Nov. 1978.

R. C. Fang, Latchup Model for the Parasitic P–N–P–N Path in Bulk CMOS, IEEE Transactions on Electron Devices, vol. Ed. 31, No. Jan. 1984.

R. R. Troutman et al. Transient Analysis of Latchup in Bulk CMOS, IEEE Transactions on Electron Devices, vol. Ed. 30, No. 2, Feb. 1993.

Farid Nemati et al, "A Novel High Density, Low Voltage SRAM Cell With a Vertical NDR Device", Center for Integrated Systems, Stanford University, CA, (2 pages).

Hyun–Jin Cho et al, "A Novel Pillar DRAM Cell for 4GBIT and Beyond", Center for Integrated Systems, Stanford University, CA, (2 pages).

(For both A and B citations above—published in IEEE 1998, Symposium on VLSI Technology, Honolulu, Hawaii, Jun. 9th and 11th, 1998).

Primary Examiner—Jerome Jackson, Jr.
Attorney, Agent, or Firm—Dickstein Shapiro Morin & Oshinsky LLP

[57] ABSTRACT

Area efficient static memory cells and arrays containing p-n-p-n or n-p-n-p transistors which can be latched-up in a bistable on state. Each transistor memory cell includes a gate which is pulse biased during the write operation to latch-up the cell. Also provided are linked memory cells in which the transistors share common regions.

47 Claims, 9 Drawing Sheets

HIGH DENSITY PLANAR SRAM CELL USING BIPOLAR LATCH-UP AND GATED DIODE BREAKDOWN

FIELD OF THE INVENTION

This invention relates generally to static memory devices. Particularly, this invention relates to a high density Static Random-Access Memory (SPAM) cell taking advantage of the latch-up phenomenon in a Complementary Metal Oxide Semiconductor (CMOS).

BACKGROUND OF THE INVENTION

There are two major types of random-access memory cells, dynamic and static. Dynamic random-access memories (DRAMs) can be programmed to store a voltage which represents one of two binary values, but require periodic reprogramming or "refreshing" to maintain this voltage for more than very short time periods. Static random-access memories (SRAMs) are so named because they do not require periodic refreshing.

SRAMs are bistable, meaning that they have two stable or self-maintaining operating states, corresponding to different output voltages. Each operating state defines one of the two possible binary bit values, zero or one. A static memory cell typically has an output which reflects the operating state of the memory cell. Such an output produces a "high" voltage to indicate a "set" operating state, usually representing a binary value of one, and produces a "low" voltage to indicate a "reset" operating state, which usually represents a zero. Without external stimuli, a static memory cell will operate continuously in a single one of its two operating states. It has internal feedback mechanisms that maintain a stable output voltage, corresponding to the operating state of the memory cell, as long as the memory cell receives power.

The operation of a static memory cell is in contrast to other types of memory cells such as dynamic cells which do not have stable operating states. A dynamic memory cell requires periodic refreshing to maintain storage of a voltage for more than very short time periods, because it has no internal feedback to maintain a stable output voltage. Without refreshing, the output of a dynamic memory cell will drift toward intermediate or indeterminate voltages, resulting in loss of data. Dynamic memory cells are used in spite of this limitation because of the significantly greater packaging densities which can be attained. For instance, a dynamic memory cell can be fabricated with a single MOSFET transistor, rather than the six transistors typically required in a static memory cell.

Conventional CMOS SRAM cells essentially consist of a pair of cross-coupled inverters as the storage flip-flop or latch, and a pair of pass transistors as the access devices for data transfer into and out of the cell. Thus, a total of six Metal Oxide Semiconductor Field Effect Transistors (MOSFETs), or four MOSFETs plus two very high resistance load devices, are required for implementing a conventional CMOS SRAM cell. The large number of devices required for each CMOS SRAM cell results in exceptionally large cell areas, typically over $100F^2$, where F is the minimum feature size. Even using only n-channel devices, cell size in a compact SRAM design is commonly over $50F^2$. See U.S. Pat. No. 5,486,717. The result is much lower densities than for DRAMs, where the cell size is only 6 or $8F^2$.

To achieve higher packing densities, several methods are known for reducing the number of devices needed for CMOS SRAM cell implementation, or the number of the devices needed for performing the Read and Write operations. However, increased process complexity, extra masks, and high fabrication cost are required and the corresponding product yield is not high.

For example, K. Sakui, et al., "A new static memory cell based on reverse base current (RBC) effect of bipolar transistor," IEEE *IEDM Tech. Dig.*, pp. 44–47, December 1988), refers to a Bipolar-CMOS (BICMOS) process in which only two devices are needed for a SRAM cell: one vertical bipolar transistor, and one MOSFET as a pass device. Extra processing steps and increased masks are required, along with special deep isolation techniques, resulting in high fabrication cost and process complexity. Yield of SRAM products utilizing such complex processes is usually low compared with the existing CMOS processes.

A problem with CMOS circuits in general is their propensity to "latch-up." Latch-up is a phenomenon that establishes a very low-resistance path between the $V_{DD}$ and $V_{SS}$ power lines, allowing large currents to flow through the circuit. This can cause the circuit to cease functioning, or even to destroy itself due to heat damage caused by high power dissipation.

The susceptibility to latch-up arises from the presence of complementary parasitic bipolar transistor structures, which result from the fabrication of the complementary MOS devices in CMOS structures. Because they are in close proximity to one another, the complementary bipolar structures can interact electrically to form device structures which behave like p-n-p-n diodes. In the absence of triggering currents, such diodes act as reverse-biased junctions and do not conduct. Such triggering currents, however, may be and in practice are established in any one or more of a variety of ways, e.g., terminal overvoltage stress, transient displacement currents, ionizing radiation, or impact ionization by hot electrons.

Gregory, B. L., et al., "Latch-up in CMOS integrated circuits," *IEEE Trans. Nucl. Sci. (USA)*, Vol. 20, no. 6, p. 293–9, proposes several techniques designed to eliminate latch-up in future CMOS applications. Other authors, such as Fang, R. C., et al., "Latch-up model for the parasitic p-n-p-n path in bulk CMOS," *IEEE Transactions on Electron Devices*, Vol. ED-31, no. 1, pp. 113–20, provide models of the latch-up phenomenon in CMOS circuits in an effort to facilitate design optimizations avoiding latch-up.

The present invention takes advantage of the normally undesirable latch-up phenomenon in CMOS circuits to construct a compact static memory cell.

SUMMARY OF THE INVENTION

The present invention provides area efficient static memory cells and memory arrays by the use of parasitic bipolar transistors which can be latched in a bistable on state with small area transistors. Each bipolar transistor memory cell includes a gate which is pulse biased during the write operation to latch-up the cell. These cells can be realized utilizing CMOS technology to create planar structures with a minimum of masking steps and minimal process complexity.

Advantages and features of the present invention will be apparent from the following detailed description and drawings which illustrate preferred embodiments of the invention.

DETAILED DESCRIPTION OF THE PREFERRED EMBODIMENT

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention.

The terms wafer or substrate used in the following description include any semiconductor-based structure having an exposed silicon surface in which to form the structure of this invention. Wafer and substrate are to be understood as including silicon-on-insulator, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base-semiconductor structure or foundation. The following detailed description is, therefore, not to be taken in a limiting sense, and the scope of the present invention is defined by the appended claims.

Figure 1:
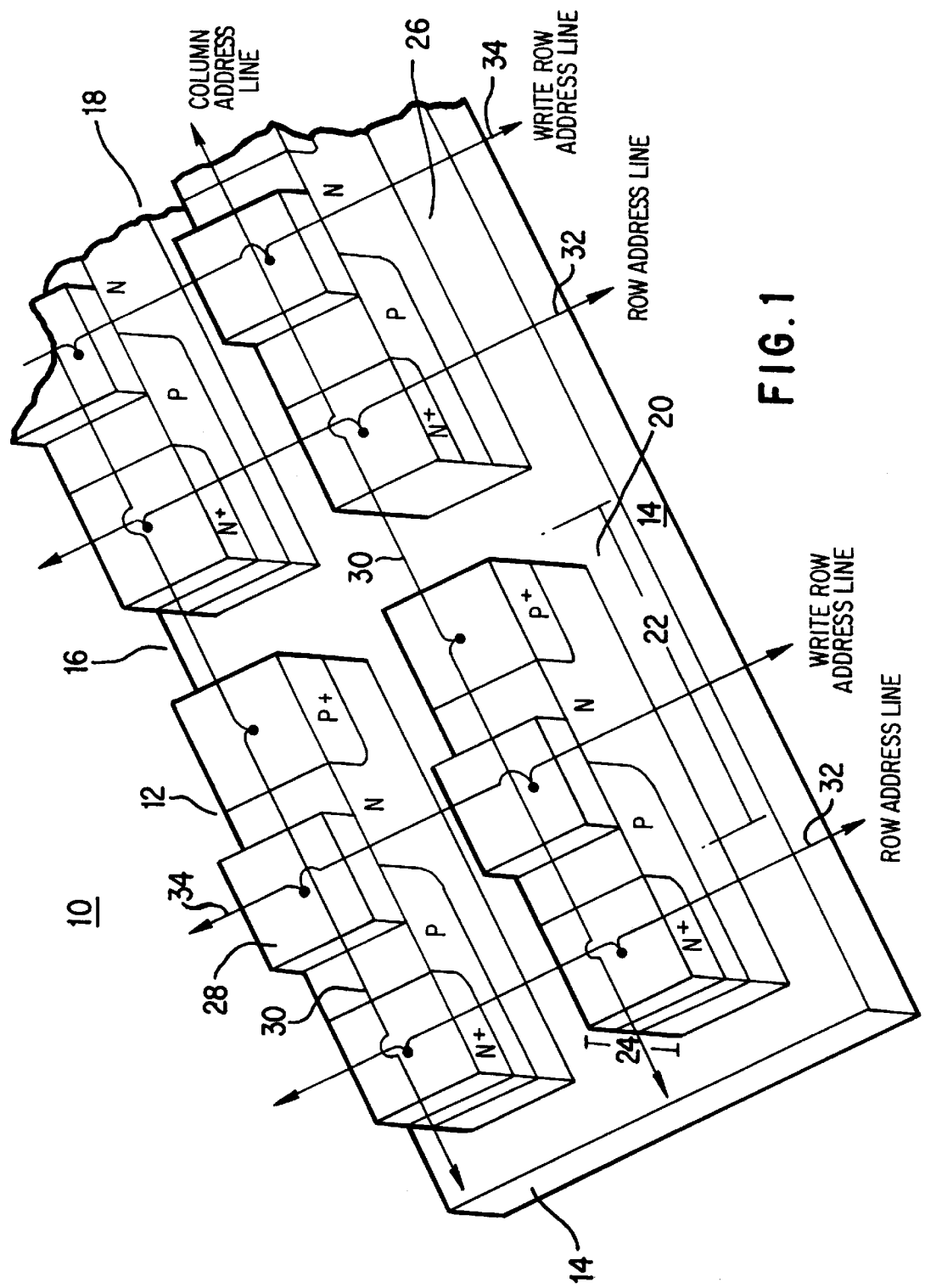
FIG. 1 is a perspective view of a SRAM cell array constructed in accordance with one embodiment of the present invention.

Referring now to the drawings, where like elements are designated by like reference numerals, an embodiment of the SRAM device array 10 of the present invention is shown in FIG. 1. The array 10 is comprised of a plurality of planar parasitic bipolar transistor pairs 12 on p-type silicon substrate 14. Planar transistor pairs or devices, noted generally 12, are separated from each other by isolation trenches 16, 18. Each parasitic bipolar transistor device 12 has dimensions of one F by four F, and each isolation trench 16, 18 is preferably one F wide. Thus, with the inclusion of transistor to transistor -isolation, the area per programmed device cell is $10F^2$ (2F×5F).

Referring to FIG. 1, a dual transistor memory cell, generally designated 20, comprises two complementary bipolar transistors 22, 24 connected with a gate 28 to form a gated diode 26. Each memory cell 20 is connected to other memory cells via three sets of interconnects. Column address line 30 is connected to the emitter of transistor 22, row address line 32 is connected to the emitter of transistor 24, and write row address line 34 is connected to the gate 28 of gated diode 26.

Figure 2:
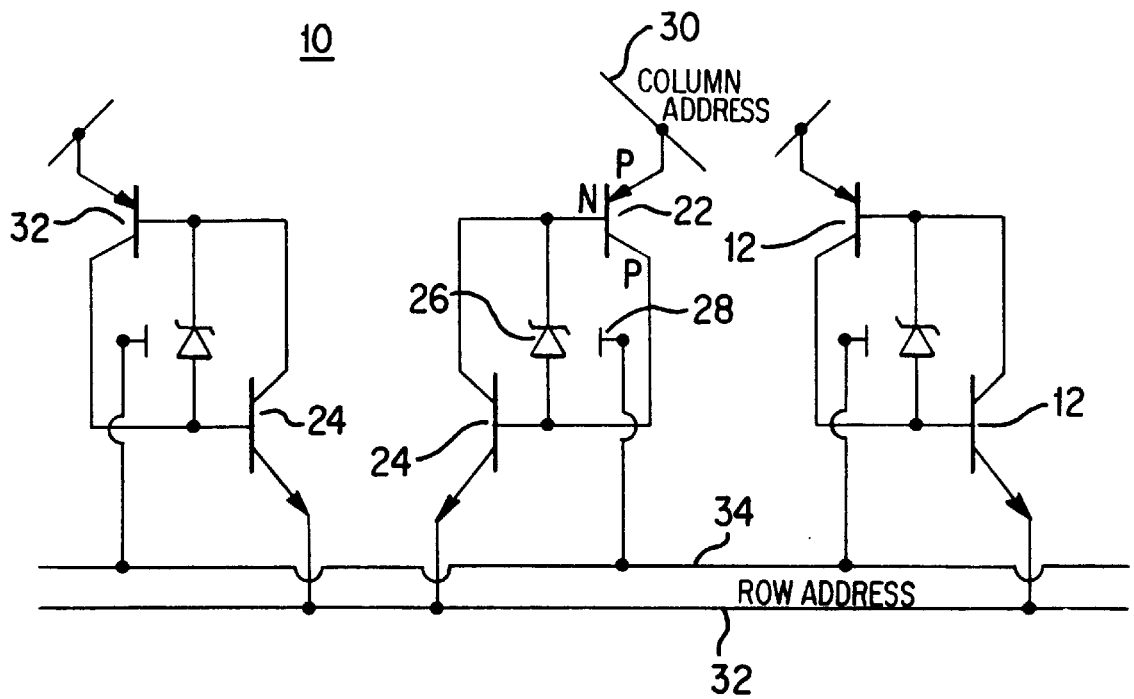
FIG. 2 is a circuit diagram illustrating one embodiment of a SRAM cell with latch-up and gated diode according to the present invention.
Figure 3:
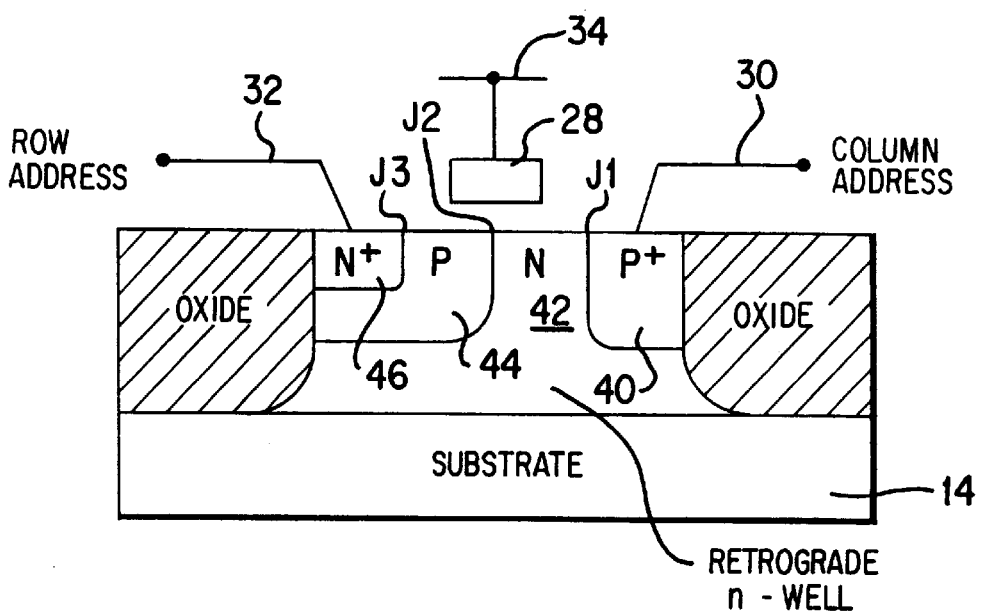
FIG. 3 is a cross-sectional view of the SRAM cell of FIG. 2 illustrating the regions and junctions of the semiconductor structure.
Figure 4:
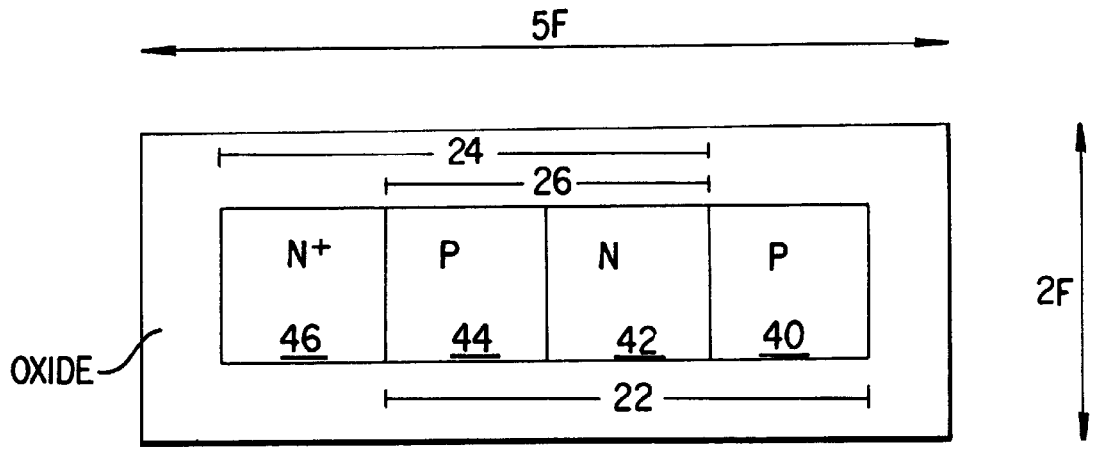
FIG. 4 is a schematic diagram illustrating the regions and features of the SRAM cell of FIG. 2.
Figures 8, 9:
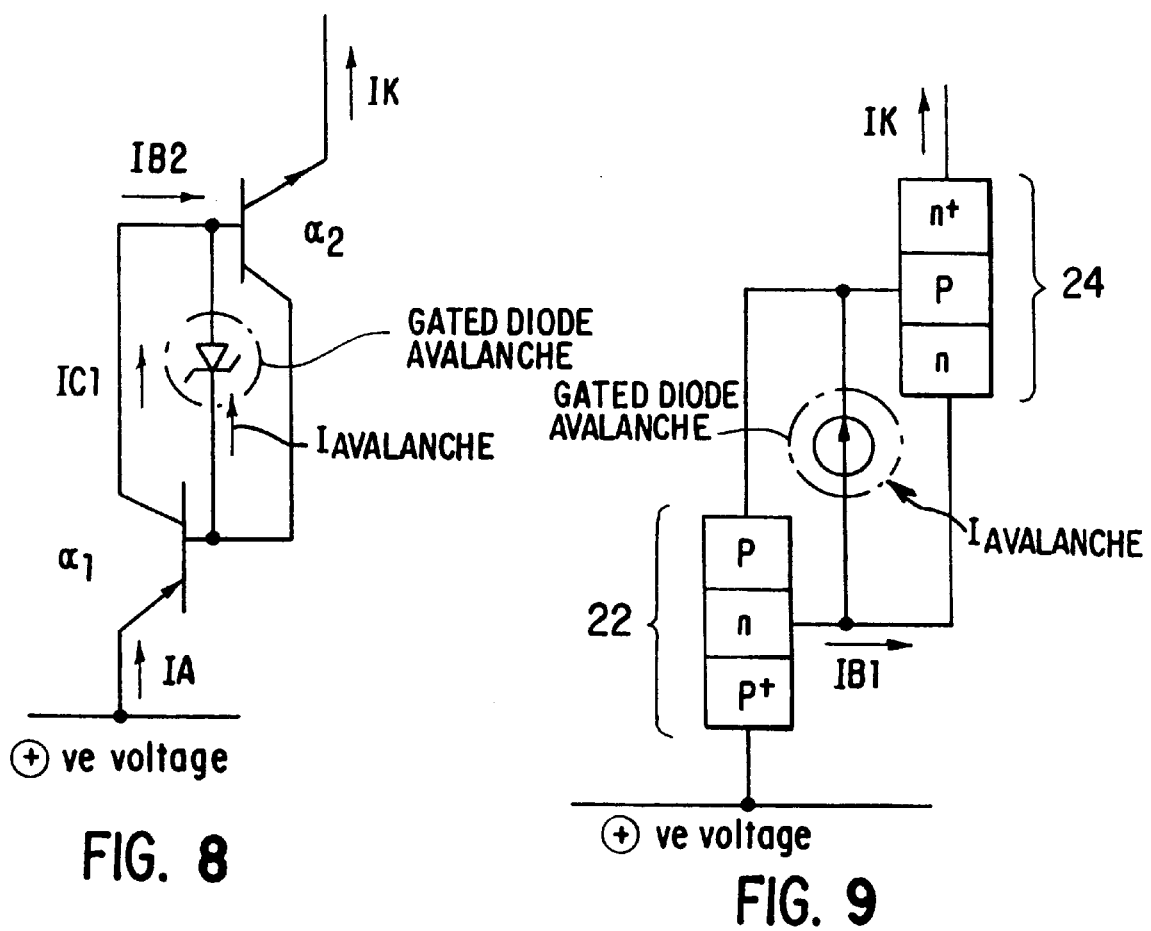
FIG. 8 is a circuit diagram for the SRAM cell of FIG. 2 having gated diode induced latch-up.
FIG. 9 is a schematic diagram for the SRAM cell of FIG. 2 having gated diode induced latch-up.
Figure 10:
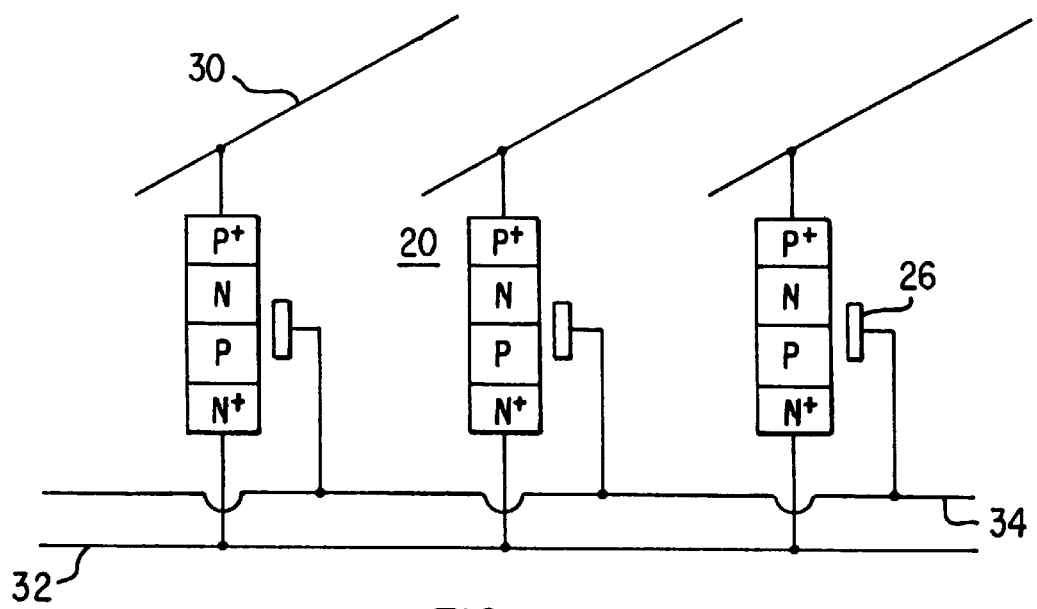
FIG. 10 is a circuit diagram illustrating a SRAM cell array with interconnect circuitry.

As shown in FIGS. 2 through 4, p+ region 40, n-region 42, and p-region 44 comprise a lateral p-n-p bipolar transistor 22; and n+ region 46, p-region 44, and n-region 42 comprise a vertical n-p-n bipolar transistor 24. N-region 42 underlies p-region 44, and is preferably formed as a retrograde n-well, meaning that the dopant is graded in the vertical direction with higher concentrations at the bottom of the well. The transistors 22, 24 are connected so that the collector of transistor 22 is connected to the base of transistor 24, and vice-versa, as shown in FIGS. 1, 2 and 8.

Referring to FIG. 3, the interface between p+ region 40 and n-region 42 comprises a first junction J1, the interface between n-region 42 and p-region 44 comprises a second junction J2, and the interface between p-region 44 and n+ region 46 comprises a third junction J3. The second junction J2 acts as a collector of holes from the first junction J1 and of electrons from the third junction J3. A gated diode 26 is formed by gating the second junction J2 with a polysilicon gate 28. At equilibrium there is a depletion region at each junction, with a built-in potential determined by the impurity doping profile. When a positive voltage is applied to the anode 40, the second junction J2 will become reverse-biased, while the first and third junctions J1, J3 will be forward-biased.

FIG. 4 provides a schematic view of the dual transistor memory cell 20. The planar structure depicted has an area of $10F^2$, a significant improvement over the prior art cells of 50 to 100 $F^2$. The dual transistor memory cell 20 operates as described hereinafter, and can best be understood by referencing FIGS. 5 through 11. Operation of the cell takes advantage of latch-up between the two complementary transistors to construct a compact SRAM cell.

Figure 5:
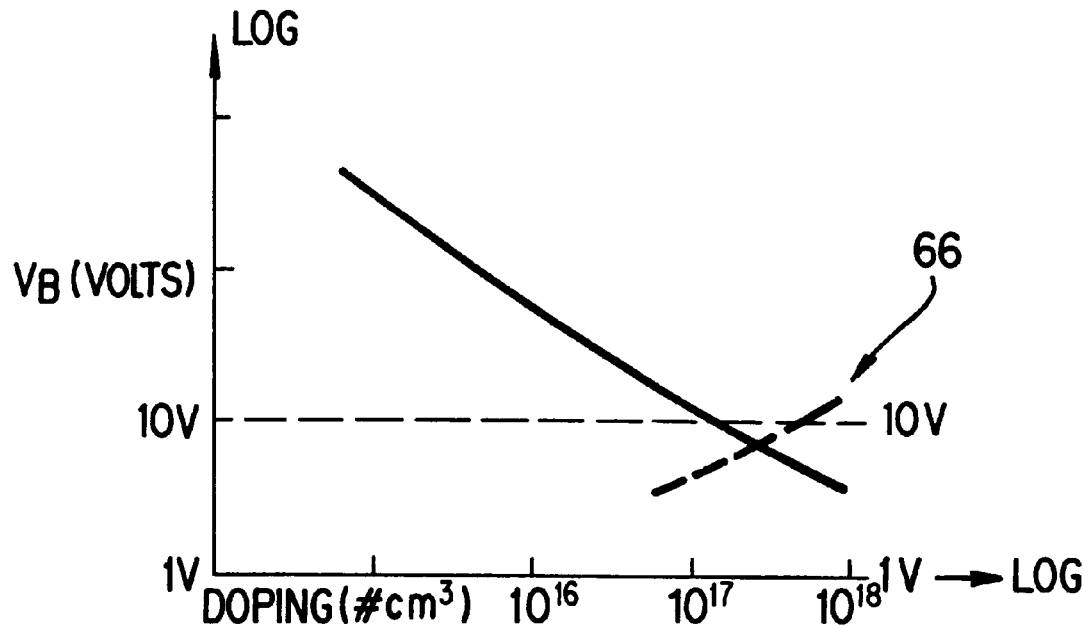
FIG. 5 is a graph illustrating current-voltage characteristics and avalanche multiplication in the gated diode structure of the SRAM cell of FIG. 2.
Figure 6:
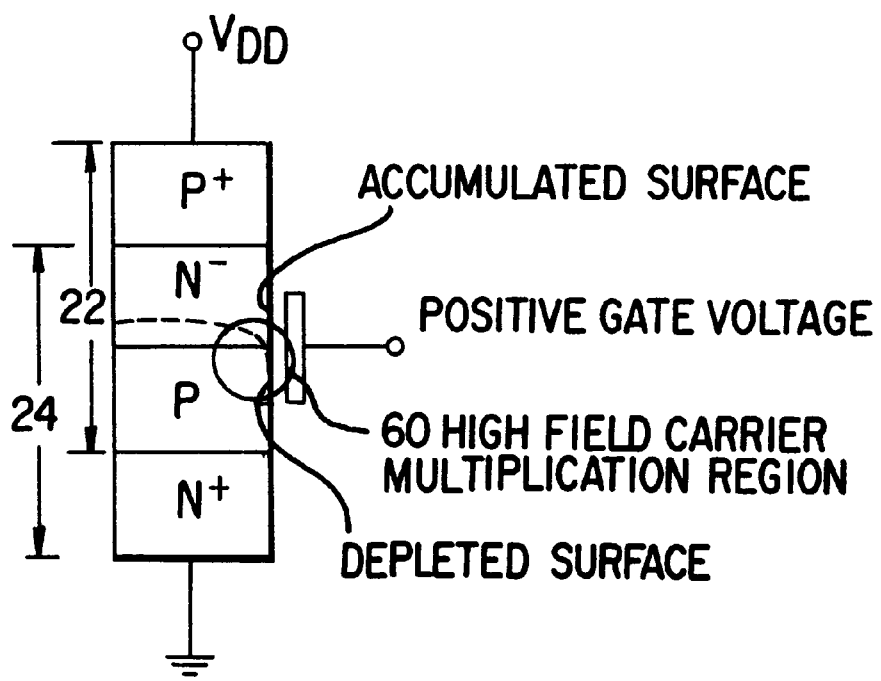
FIG. 6 is a schematic diagram illustrating the regions involved in avalanche multiplication in the SRAM cell of FIG. 2.

If bipolar transistors 22, 24 are off, then the cell will block and not become latched-up until the power supply voltage, $V_{DD}$, becomes very high. However, the cell can be induced to latch-up at lower voltages by the application of a pulsed gate bias, thus inducing avalanche multiplication and breakdown in the gated diode structure 26. As shown in FIG. 5, the breakdown voltage of an abrupt planar junction with a doping on the lightly doped side of the junction (n-type region 42 in FIG. 3) of ~$1.5 \times 10^{17}$ cm$^{-3}$, is approximately 8 volts. For higher doping levels, band to band tunneling occurs and thus places a higher limit on the desired doping, as indicated by line 66. The doping of the heavily doped side (p-type region 44 in FIG. 3) should preferably have a concentration of $1 \times 10^{19}$ cm$^{-3}$ in order to achieve an abrupt junction. By biasing the gate over the junction such that the heavily doped region 44 is depleted to the extent that the field at the surface of the silicon is above the critical field value of $6 \times 10^5$ Mv/cm, impact ionization will occur near the surface at a lower junction reverse bias voltage. In fact, under these conditions, the field configuration leading to carrier multiplication is controlled primarily by the gate, as shown by region 60 in FIG. 6. Thus, with a gate oxide thickness of 100 Å and an n+ poly silicon gate, the breakdown voltage of the junction can be lowered to a power supply voltage of approximately 3 volts with a gate voltage in the range of 4 volts.

Figure 7:
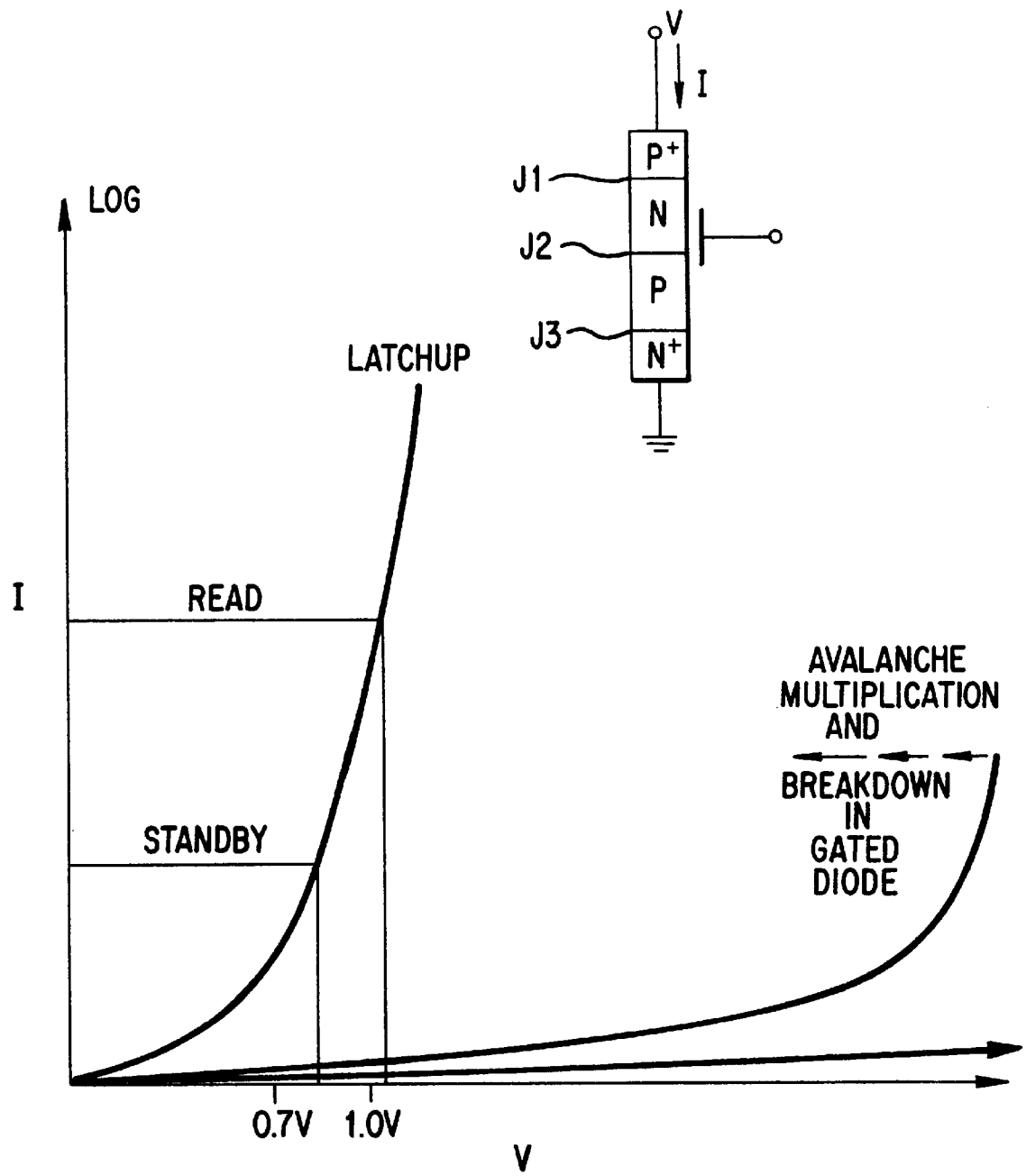
FIG. 7 is a graph depicting the blocking, write and latch-up states of the SRAM cell of FIG. 2.

To turn on the device, an external stimulus such as a base current must be introduced. Base current can be generated by introducing a pulsed gate bias and higher column voltage that initiates current multiplication in the gated diode. The pulse level must be calculated to yield sufficient current so that the sum of the common base current gains, $\alpha_1$ and $\alpha_2$, of bipolar transistors 22, 24 exceeds one. The bias applied to induce latch-up is "pulsed" in the sense that it is only applied to initiate latch-up. As shown in FIG. 7, the cell is stable in the latched-up condition as a result of the pulse-initiated latch-up, which occurs during the "write" operation as discussed below.

The collector and base currents ($I_C$ and $I_B$, respectively) and the common base forward current transfer ratios or "current gain" $\alpha_1$ and $\alpha_2$ are shown in FIG. 8. From FIG. 8, the collector current of the n-p-n transistor 24 provides the base drive for the p-n-p transistor 22. Also, the collector current of the p-n-p transistor 22 supplies the base drive for the n-p-n transistor 24. The base current of p-n-p transistor 22, $IB_1$, is given by $$I_{B1} = (1-\alpha_1)I_A$$

which is supplied by the collector of n-p-n transistor 24. The collector current of n-p-n transistor 24 with a common base current gain, $\alpha_2$, is given by $$I_{C2} = \alpha_2 I_K$$

By equating $I_{B1}$ and $I_{C2}$ with $I_{AVALANHE}$:

$$I_{B1} - I_{AVALANCHE} = I_{C2}$$

Since $I_A = I_K$, when the collector-base reverse saturation currents approach zero (neglecting leakage), then:

$$I_A = \frac{I_{AVALANCHE}}{1-(\alpha_1+\alpha_2)}$$

which gives the static characteristic of the device up to the breakdown voltage. $I_{AVALANCHE}$ is small, so $I_A$ is small, unless $(\alpha_1+\alpha_2)$ approaches unity; at this point, the denominator of the equation approaches zero, and latch-up will occur.

Figure 11:
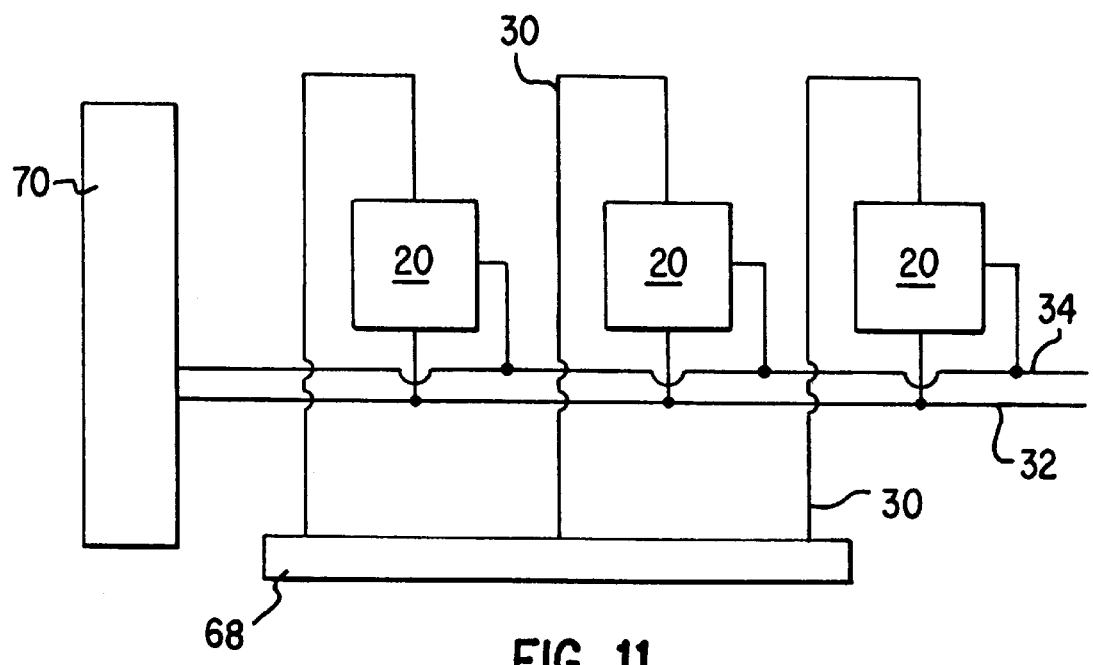
FIG. 11 is a circuit diagram illustrating a SRAM cell array with interconnect and peripheral circuitry.

Referring now to FIG. 11, the array structure of the CMOS SRAM includes column decoder 68 and row decoder 70. When the cell is not addressed, it is maintained in a low voltage state with $V_{DD}$ around 0.7 V to 0.8 V from the column address line 30 and the row address line 32 to reduce power consumption. Data is read by addressing a row and a column and increasing the power supply voltage across device 20 to 0.9 V or more at the coincidence of the column address line 30 and the row address line 32. If the cell is latched-up, a large current will be sensed between these row and column lines. If not latched-up, there will be little extra current.

Write is accomplished by raising the voltage across the cell at the coincidence of the write row address line 34 and column address line 30, to induce carrier multiplication in the gated diode 26. The high voltage induces avalanche breakdown in the gated diode 26, and turns the transistors on strongly. The transistors then latch-up, so that the cell now will be read as storing a "one." The voltage in the write row address line 34 may be immediately lowered once the write operation is completed.

To "erase" or write a "zero" into a cell, the entire row must be erased and rewritten. To do so, the row voltage becomes positive to leave some very low value like 0.4 V or less across all transistors in the row to turn off any transistors which are latched-up. This very low voltage is similar to cutting the power to the row off, and it causes all cells along the row to unlatch, thus "writing" a "zero" into each cell. Sufficient time is then allowed for any excess base charge in the formerly latched-up cells to recombine. Following this, "ones" are written into selected locations along the word line by raising the voltage from write row address line 34 and column address line 30, as described above.

In 0.2 micron technology, at moderate forward bias during the read operation, transistor devices 20 will provide about 100 $\mu$A of current. If this is read in 1.6 nanoseconds, then the total signal will be one million electrons, which is comparable to the read signal in DRAMs and easily sensed above any noise. A $4F^2$ cell will result in an area of less than 1 cm$^2$ for a 128 Mbit SRAM in 0.2 micron technology. If the standby current in each cell is 10 nanoamperes, then the standby current will be 1.28 A and the power dissipation about 1 Watt or 1 Watt/cm$^2$, which is easily dissipated. A ratio of read current to standby current of 100 $\mu$A/0.01 $\mu$A can be achieved since the read current is an exponential function of voltage, as shown in FIG. 7. These considerations can readily be scaled to other size, or minimum feature size, dimensions.

Figure 12:
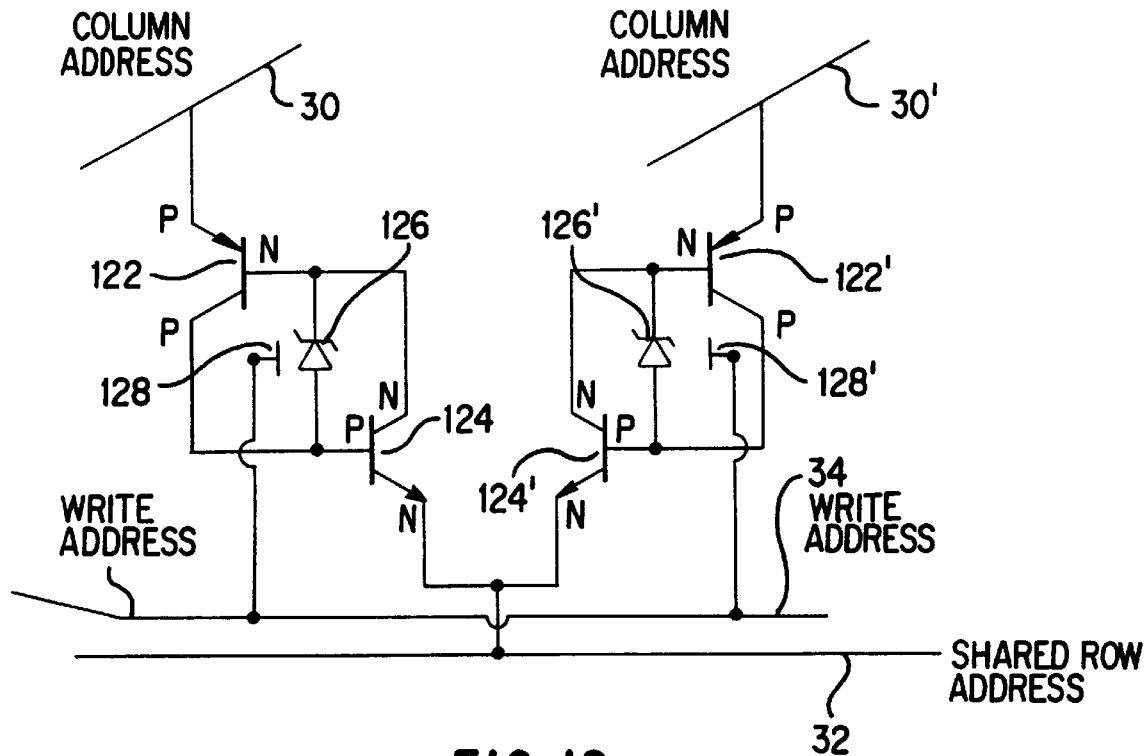
FIG. 12 is a circuit diagram illustrating a second embodiment of a SRAM cell with latch-up and gated diode, and a shared n-p-n emitter and row address according to the present invention.
Figure 13:
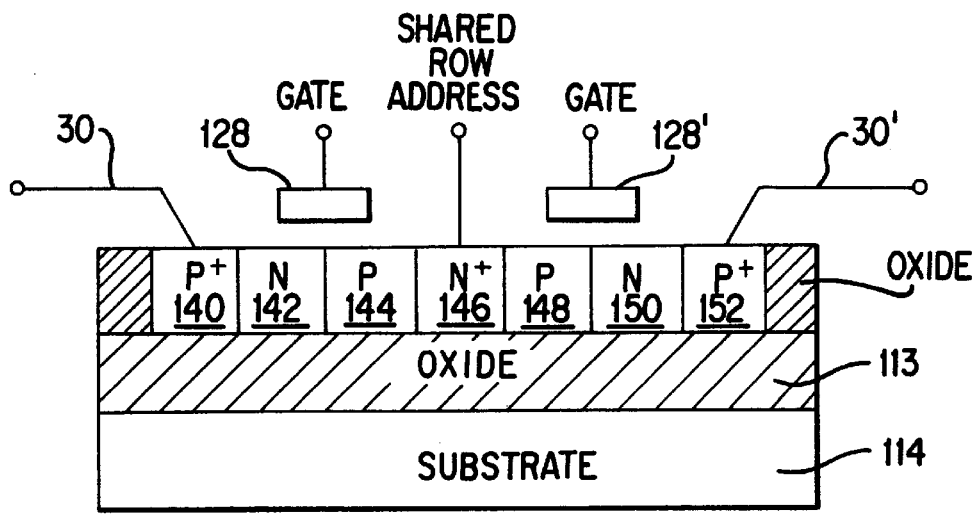
FIG. 13 is a cross-sectional view of the SRAM cell of FIG. 12 illustrating the regions and junctions of the semiconductor structure.

A second embodiment of the present invention involves the interconnection of two memory cells so that they share a common n-p-n emitter, as shown in FIGS. 12 and 13. Each parasitic bipolar transistor device 120, 120' comprises two complementary bipolar transistors 122, 124 connected with a gate 128 to form a gated diode 126. Each transistor device 120 is connected to another transistor device 120' via a shared emitter region 146, as can best be seen by reference to FIGS. 12 and 13. Column address lines 30 and 30' are connected to the emitters of transistors 122 and 122', respectively, while row address line 32 is connected to the common emitter of transistors 124 and 124'. Write row address line 34 is connected to the gates 128 and 128' of the gated diodes 126 and 126'.

Figure 14:
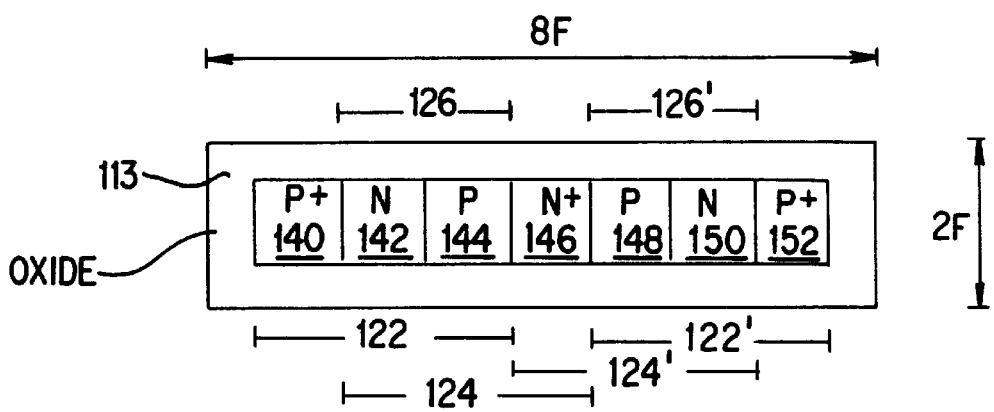
FIG. 14 is a schematic diagram illustrating the regions and features of the SRAM cell of FIG. 12.

As can best be seen in FIG. 14, p+ region 140, n-region 142, and p-region 144 comprise a p-n-p bipolar transistor 122; n+ region 146, p-region 144, and n-region 142 comprise an n-p-n bipolar transistor 124; n+ region 146, p-region 148, and n-region 150 comprise an n-p-n bipolar transistor 124'; and p-region 148, n-region 150, and p+ region 152 comprise a p-n-p bipolar transistor 122'. The transistors 122, 124 are connected so that the collector of transistor 124 is connected to the base of transistor 122, and vice-versa. Transistors 122', 124' are interconnected in a similar fashion. In addition, transistors 124, 124' share the same emitter n+ region 146 that is connected to the row address line 32.

The linked bipolar transistor devices 120, 120' function similarly to the single unlinked cell of the first embodiment. Because the write row address line 34 is still individually connected to each cell, and because each of the read and write operations operates at the coincidence of a column and a row, functioning of the devices 120 and 120' is not affected by their linkage. The shared emitter region 146 and shared row address enable the cells to be manufactured in a denser array. In addition, the linked cells may be formed as a silicon-on-insulator (SOI) structure, with a layer of oxide 113 between the device and the underlying substrate 114 serving to isolate the device and permit denser packing of cells. The two interlinked cells 120, 120' have a total area of $16F^2$, resulting in a per cell area of $8F^2$.

Figure 15:
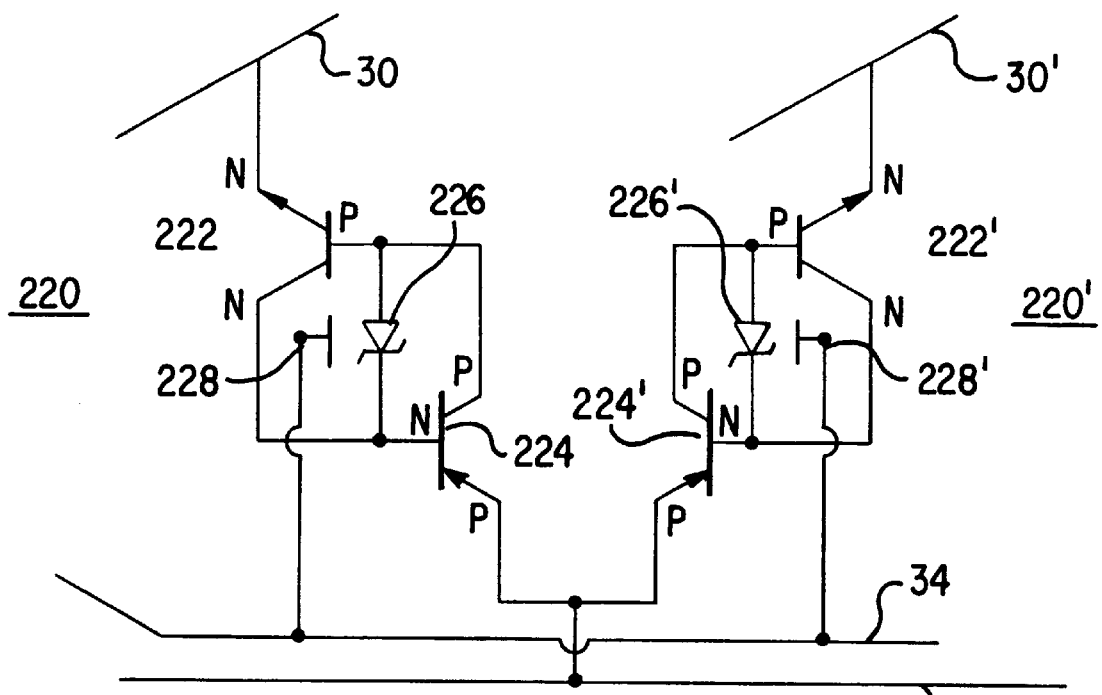
FIG. 15 is a circuit diagram illustrating a third embodiment of a SRAM cell with latch-up and gated diode, and a shared p-n-p emitter and row address according to the present invention.
Figure 16:
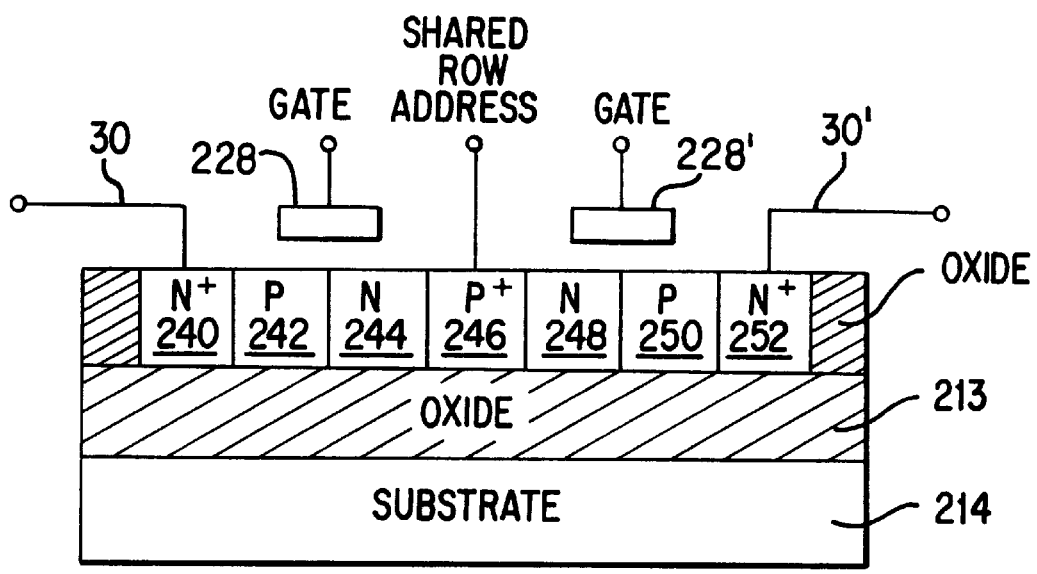
FIG. 16 is a cross-sectional view of the SRAM cell of FIG. 15 illustrating the regions and junctions of the semiconductor structure.

A third embodiment of the present invention involves the interconnection of two memory cells so that they share a common p-n-p emitter, as shown in FIGS. 15 and 16. Each parasitic bipolar transistor device 220, 220' comprises two complementary bipolar transistors 222, 224 connected with a gate 228 to form a gated diode 226. The transistor device 220 is connected to another transistor device 220' via a shared emitter region 246, as can best be seen by reference to FIGS. 15 and 16. Column address lines 30 and 30' are connected to the emitters of transistors 222 and 222', respectively, while row address line 32 is connected to the common emitter of transistors 224 and 224'. Write row address line 34 is connected to the gates 228 and 228' of the gated diodes 226 and 226'.

Figure 17:
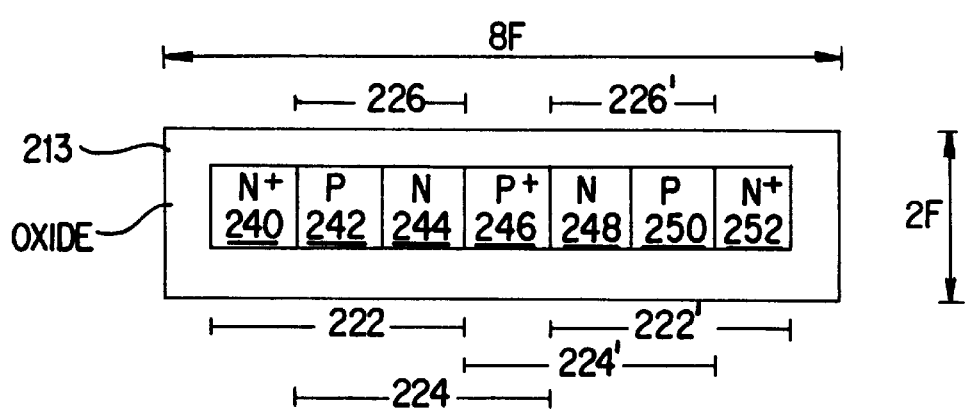
FIG. 17 is a schematic diagram illustrating the regions and features of the SRAM cell of FIG. 15.

As can best be seen in FIG. 17, n+ region 240, p-region 242, and n-region 244 comprise an n-p-n bipolar transistor 222; p+ region 246, n-region 244, and p-region 242 comprise a p-n-p bipolar transistor 224; p+ region 246, n-region 248, and p-region 250 comprise a p-n-p bipolar transistor 224'; and n-region 248, p-region 250, and n+ region 252 comprise an n-p-n bipolar transistor 222'. The transistors 222, 224 are connected so that the collector of transistor 224 is connected to the base of transistor 222, and vice-versa. Transistors 222', 224' are interconnected in a similar fashion. In addition, transistors 224, 224' share the same emitter p+ region 246 that is connected to the row address line 32.

The linked bipolar transistor devices 220, 220' function similarly to the single, unlinked cell of the first embodiment. Because the write row address line 34 is still individually connected to each cell, and because each of the read and write operations operates at the coincidence of a column and a row, functioning of the devices 220, 220' is not affected by their linkage. The shared emitter region 246 and shared row address enable the cells to be manufactured in a denser array. In addition, the linked cells may be formed as a silicon-on-insulator (SOI) structure, with a layer of oxide 213 between the device and the underlying substrate 214 serving to isolate the device and permit denser packing of cells. Two interlinked cells 220, 220' have a total area of $16F^2$, resulting in a per cell area of $8F^2$.

The device array 10 of the first embodiment is manufactured through an exemplary process described as follows, resulting in the complete structure shown in FIG. 1. It is to be understood, however, that this process is only one example of many possible processes. For example, although the process as described begins with a p-type substrate, other processes may begin with a silicon-on-insulator (SOI) substrate. Another example is that a CMOS process involving standard twin-well process technology may be used instead of the disclosed process. Variants of the masking and etching processes are also contemplated, as is the use of conventional wells instead of implanted wells. The following description is, therefore, not to be taken in a limiting sense, and the scope of the present invention is defined by the appended claims.

First, a silicon substrate 14 is selected as the base for the device array 10. The silicon substrate 14 may be doped or undoped, but a doped p-type wafer is preferred. Next, a thin oxide layer is grown on top of the silicon substrate by means of thermal oxidation, or other suitable means. A silicon nitride ($Si_3N_4$) ("nitride") layer is then formed, by chemical vapor deposition (CVD) or other deposition means, on top of the oxide layer. A photoresist and mask are applied, and photolithographic techniques are used to define areas to be etched-out. Etching is then carried out to etch through the nitride and oxide layers to expose trenches 16, 18 in which field oxide is to be formed.

The photoresist and mask are then removed, and field oxide is then formed in the exposed trenches 16, 18, by a suitable process such as low-pressure CVD of silicon dioxide or thermal oxidation of the exposed substrate 14. A photoresist and mask are then applied to cover areas not to be doped in the following steps. N-wells are then formed by high-energy ion implantation of arsenic, phosphorus or antimony into the exposed areas. Retrograde doping, where the concentration of n-dopant is highest at the bottom of the well, is achieved by extremely high-energy ion implantation at the MeV level.

The photoresist and mask are then removed, and new photoresist and mask are applied to cover areas that are not to be counter-doped to form p-regions inside the n-wells, such as p-regions 40 and 44 shown in FIG. 1. Ion implantation of boron is then performed to counter-dope the exposed regions and form p-regions. The photoresist and mask are then removed, and new photoresist and mask are applied to cover areas that are not to be counter-doped to form n-regions inside some of the p-regions, such as the n+region 46 shown in FIG. 1. Ion implantation of arsenic, phosphorus or antimony is then performed to counter-dope the exposed regions and form n-regions 46. The four regions of each device 20 have now been formed, as the formation of the regions 40, 44, and 46 inside the n-well leaves the remaining area of the n-well as region 42 of the device 20.

A gate 28 is then formed over the central n-p junction J2 of each device 20. A thin gate oxide layer is formed on top of the junction by a suitable means, and then a polysilicon layer is deposited to serve as a gate layer. The device array 10 then undergoes a finishing process. Selective etching with hot phosphoric acid or another suitable etchant is performed to remove any remaining masking layers or nitride layers from the top surface of the devices 20. If necessary, planarization by chemical-mechanical polishing or other suitable processes may be performed. Conventional processing methods may then be used to form contact holes and metal wiring to connect the devices. The final structure of the device array 10 is as shown in FIG. 1.

The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A memory cell, comprising a gated diode having bistable current states for storing information, one of said current states being achieved by operation of gate-induced latch-up of said diode, where said memory cell is linked to a second memory cell so that both memory cells share a common region.

2. The memory cell of claim 1 wherein said gated diode is a four-region diode.

3. The memory cell of claim 2 wherein said four-region diode is a p-n-p-n diode, and the memory cell is linked to a second memory cell having a gated p-n-p-n diode so that the two p-n-p-n diodes share a common n-region.

4. The memory cell of claim 2 wherein said four-region diode is an n-p-n-p diode, and the memory cell is linked to a second memory cell having a gated n-p-n-p diode so that the two n-p-n-p diodes share a common p-region.

5. The memory cell of claim 2 wherein said four-region diode comprises two complementary planar bipolar transistors.

6. The memory cell of claim 1 wherein the gate of said gated diode overlies a central junction of said gated diode.

7. The memory cell of claim 1 wherein said gate-induced latch-up is achieved by a pulsed gate bias.

8. The memory cell of claim 1 wherein said cell is a static random access memory cell.

9. The memory cell of claim 1 wherein said cell has an area of approximately 8 to $10F^2$ where F is the minimum lithographic dimension.

10. The memory cell of claim 6 wherein p and n regions of said central junction have respective p and n dopant concentrations of at least about $10^{18}$ atoms per cm$^3$.

11. A circuit for storing information as one of at least two
  a multi-region thyristor having at least four regions; and
  at least one gate in contact with a junction of said multi-region thyristor, wherein said gate is connected to a voltage source for producing latch-up in said multi-region thyristor, where said multi-region thyristor is linked to a second multi-region thyristor so that both multi-region thyristors share a common region.

12. The circuit of claim 11 wherein said latch-up provides one of the stable current states for storing information in said circuit.

13. The circuit of claim 11 wherein said latch-up is produced by providing positive voltage to said gate.

14. The circuit of claim 11 wherein said latch-up is produced by providing a pulsed bias to said gate.

15. The circuit of claim 11 wherein said multi-region thyristor comprises a seven-region thyristor.

16. The circuit of claim 15 wherein said at least one gate comprises a first gate overlying a second junction of the seven-region thyristor, and a second gate overlying a fifth junction of the seven-region thyristor.

17. The circuit of claim 16 wherein said circuit comprises two memory cells.

18. The circuit of claim 17 further comprising a shared row address line in connection with a central region of said seven-region thyristor.

19. The circuit of claim 11 further comprising a write row address line in connection with said at least one gate.

20. A SRAM array, comprising:
  a pair of memory cells each having a four-region latch with a gate in contact with a central junction of said four-region latch, wherein said gate is connected to a voltage source for producing latch-up in said four-region latch; and
  wherein said cells are linked so that the four-region latches of each cell overlap to share a common region.

21. The SRAM array of claim 20 wherein said four-region latch is a p-n-p-n latch, and said cells share a common n region.

22. The SRAM array of claim 20 wherein said four-region latch is an n-p-n-p latch, and said cells share a common p region.

23. The SRAM array of claim 20 wherein said latch-up provides one of the bistable current states for storing information in said cells.

24. The SRAM array of claim 20 wherein said latch-up is produced by providing positive voltage to at least one of said gates.

25. The SRAM array of claim 20 wherein said latch-up is produced by providing a pulsed bias to at least one of said gates.

26. The SRAM array of claim 20 wherein said four-region latch comprises two complementary planar bipolar transistors.

27. The SRAM array of claim 20 further comprising a row address line in connection with the common region of said cells.

28. The SRAM array of claim 20 further comprising a write row address line in connection with the gate of each cell.

29. A SRAM array, comprising:
  a substrate;
  a plurality of planar four-region transistors each having a gate overlying a central junction of said planar four-region transistors, where said plurality of transistors are linked so that said plurality of transistors share a common region; and
  gate lines connecting the gates to a voltage source for producing latch-up in said four-region transistors.

30. The SRAM array of claim 29 wherein said latch-up provides one of the stable current states for storing information in said planar four-region transistors.

31. The SRAM array of claim 29 further comprising an insulating material layer between each of said transistors and the substrate, horizontally isolating the transistors.

32. The SRAM array of claim 31 wherein said insulating material is an oxide.

33. A computer system, comprising:
  a processor; and
  a memory circuit connected to the processor, the memory circuit containing at least one memory cell comprising a gated four-region diode having bistable current states for storing information, one of said current states being achieved by operation of gate-induced latch-up of said four-region diode, where said at least one memory cell is linked to a second memory cell so that both memory cells share a common region.

34. The computer system of claim 33 wherein the four-region diode is a p-n-p-n diode.

35. The computer system of claim 33 wherein the four-region diode is an n-p-n-p diode.

36. The computer system of claim 33 wherein two memory cells of said at least one memory cell are linked so that the two four-region diodes share a common region.

37. The computer system of claim 33 wherein said gated four-region diode comprises two complementary bipolar transistors.

38. The computer system of claim 33 wherein the gate of said gated four-region diode overlies a central junction of said gated four-region diode.

39. The computer system of claim 38 wherein said gate-induced latch-up is achieved by a pulsed gate bias.

40. The computer system of claim 33 wherein said memory cell is a static random access memory cell.

41. The computer system of claim 33 wherein said static random access memory cell has an area of approximately 8 to $10F^2$ where F is the minimum lithographic dimension.

42. A method of storing a binary logic value comprising:

inducing latch-up in a four region gated diode, where at least one region of said four region gated diode is linked to a second gated diode so that both diodes share a common region.

43. The method of claim 42 wherein the step of inducing latch-up further comprises application of a pulsed gate bias.

44. The method of claim 43 wherein said pulsed gate bias is approximately one volt.

45. The method of claim 42 wherein the step of inducing latch-up further comprises inducement of carrier multiplication and breakdown in the gated diode.

46. The method of claim 42 wherein the step of inducing latch-up further comprises application of a positive voltage.

47. The method of claim 46 wherein said positive voltage is approximately one volt.

* * * * *

UNITED STATES PATENT AND TRADEMARK OFFICE
CERTIFICATE OF CORRECTION

PATENT NO.    : 6,104,045
DATED         : August 15, 2000
INVENTOR(S)   : Leonard Forbes et al.

It is certified that error appears in the above-identified patent and that said Letters Patent is hereby corrected as shown below:

Column 4,
Line 16, change "transistor-isolation" to -- transistor isolation --.

Column 5,
Line 38, change "$IB_1$," to -- $I_{B1}$, --;
Line 47, change "$I_{AVALANHE}$:" to -- $I_{AVALANCHE}$: --.

Claim 11,
Line 1, change "as one of at least two" to -- as one of at least two possible stable current states, comprising: --.

Signed and Sealed this

Twelfth Day of March, 2002

Attest:

JAMES E. ROGAN
Attesting Officer    Director of the United States Patent and Trademark Office

UNITED STATES PATENT AND TRADEMARK OFFICE
CERTIFICATE OF CORRECTION

PATENT NO. : 6,104,045
DATED : August 15, 2000
INVENTOR(S) : Leonard Forbes et al.

It is certified that error appears in the above-identified patent and that said Letters Patent is hereby corrected as shown below:

Column 1,
Line 8, change "(SPAM)" to -- (SRAM) --

Signed and Sealed this

Twenty-third Day of September, 2003

JAMES E. ROGAN
*Director of the United States Patent and Trademark Office*